(12) United States Patent
Sharma et al.

(10) Patent No.: US 9,263,265 B2
(45) Date of Patent: Feb. 16, 2016

(54) CRYSTALLIZATION OF AMORPHOUS FILMS AND GRAIN GROWTH USING COMBINATION OF LASER AND RAPID THERMAL ANNEALING

(71) Applicant: Applied Materials, Inc., Santa Clara, CA (US)

(72) Inventors: Shashank Sharma, San Jose, CA (US); Shankar Muthukrishnan, San Jose, CA (US); Abhilash J. Mayur, Salinas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/472,825

(22) Filed: Aug. 29, 2014

(65) Prior Publication Data

US 2015/0064933 A1    Mar. 5, 2015

Related U.S. Application Data

(60) Provisional application No. 61/872,188, filed on Aug. 30, 2013.

(51) Int. Cl.
*H01L 21/48* (2006.01)
*H01L 21/02* (2006.01)
*H01L 21/324* (2006.01)
*H01L 21/67* (2006.01)

(52) U.S. Cl.
CPC .... *H01L 21/02683* (2013.01); *H01L 21/02532* (2013.01); *H01L 21/324* (2013.01); *H01L 21/67115* (2013.01); *H01L 21/67248* (2013.01)

(58) Field of Classification Search
CPC ..................... H01L 21/02683; H01L 21/0223; H01L 21/324; H01L 21/3065; H01L 21/67248
USPC .......... 438/149, 151, 466; 219/121.64, 121.8, 219/121.86
See application file for complete search history.

(56) References Cited

U.S. PATENT DOCUMENTS

| | | | | |
|---|---|---|---|---|
| 5,407,119 | A * | 4/1995 | Churchill | B23K 1/0056 219/121.64 |
| 8,742,253 | B1 * | 6/2014 | Menezes | H01L 31/3022 136/263 |
| 2007/0099352 | A1 * | 5/2007 | Ro | H01L 21/2022 438/149 |
| 2011/0306183 | A1 * | 12/2011 | Kim | C23C 16/24 438/466 |
| 2015/0111341 | A1 * | 4/2015 | Lee | H01L 21/268 438/107 |

* cited by examiner

*Primary Examiner* — Michael Lebentritt
(74) *Attorney, Agent, or Firm* — Patterson & Sheridan, LLP

(57) ABSTRACT

A method is disclosed for crystallizing semiconductor material so that it has large grains of uniform size comprising delivering a first energy exposure of high intensity and short duration, and then delivering at least one second energy exposures of low intensity and long duration. The first energy exposure heats the substrate to a high temperature for a duration less than about 0.1 sec. The second energy exposure heats the substrate to a lower temperature for a duration greater than about 0.1 sec.

20 Claims, 6 Drawing Sheets

CRYSTALLIZATION OF AMORPHOUS FILMS AND GRAIN GROWTH USING COMBINATION OF LASER AND RAPID THERMAL ANNEALING

CROSS-REFERENCE TO RELATED APPLICATIONS

This application claim benefit of U.S. Provisional Patent Application Ser. No. 61/872,188 filed Aug. 30, 2013, which is incorporated herein by reference.

FIELD

Embodiments described herein relate generally to the manufacture of semiconductor devices. More specifically, methods and apparatus described herein relate to thermal treatment methods and apparatus for forming crystalline semiconductors.

DESCRIPTION OF THE RELATED ART

As the size of electronic devices continues to shrink, a need to overcome the scaling limit and reduce bit cost has led to development of 3D stacked architectures in memory devices. These architectures may use polycrystalline semiconductor materials as a transistor channel material instead of single-layer crystal silicon in planar memory devices. In general, large grain crystals have lower resistivity than smaller grain crystals or amorphous materials, making large grain crystal preferable. In some cases, the 3D structure, and the polycrystalline transistor channel, may extend deep into the surface of the device.

A number of methods are available for forming crystals, many of which involve heating a semiconductor above the material's melting temperature and then allowing the material to cool so that the melted material freezes into crystals. According to one such method, a laser melts amorphous semiconductor material and then allows the material to cool enough that the melted material freezes into crystals. Laser penetration into the surface of a workpiece is typically very shallow, so in most cases this method only crystallizes the semiconductor material at the very top of the transistor channel.

According to another method, Rapid Thermal Processing (RTP) is used to heat the amorphous semiconductor material, and then the substrate is allowed to crystallize. With RTP, however, the resulting crystal growth is not uniformly large.

What is needed in the art is a method for crystallizing semiconductor materials that results in large grains of uniform size from the top of the transistor channel to the bottom of the transistor channel.

SUMMARY OF THE INVENTION

Embodiments described herein provide methods and apparatus for treating a substrate in which a first energy exposure with a high intensity and short duration is delivered to a portion of the substrate that heats the portion of the substrate to a temperature between about 700° C. and about 1,700° C. for a duration less than 0.1 seconds, and then a second energy exposure is delivered to the portion of the substrate that heats the portion of the substrate to a temperature between about 500° C. and about 1,300° C. for a longer duration than the first exposure, for example a duration greater than about 0.1 seconds, for example between about 1 sec and about 6 hours. The first energy exposure may be performed at an energy density greater than about 10 mJ/cm$^2$.

Other embodiments described herein provide methods and apparatus for treating a substrate in which an intense, incoherent energy exposure with a duration between about 1 msec and about 1 sec is delivered to the substrate, and then an intense, partially coherent energy exposure with a duration between about 1 msec and about 1 sec is delivered to successive portions of the substrate. Each energy exposure may be performed at an energy density greater than about 10 mJ/cm$^2$.

An apparatus for forming large crystal grains in a semiconductor material comprises a first thermal processing chamber in which a first energy exposure is directed to the substrate, a second thermal processing chamber, in which a second energy exposure is directed to the substrate, and a transfer chamber in which the substrate is transferred from the first thermal processing chamber to the second thermal processing chamber. The first thermal processing chamber may be a laser processing chamber that heats each portion of the substrate to a temperature between about 700° C. and about 1,700° C., such as by delivering energy having a density greater than 10 mJ/cm$^2$, for example 20 mJ/cm$^2$ to each portion of the substrate, over a duration less than 0.1 seconds, for example 1 msec. The second thermal processing chamber may be a lamp processing chamber that heats each portion of the substrate to a temperature between about 500° C. and about 1,300° C., such as by delivering energy having a density less than 10 mJ/cm$^2$, for example 0.5 mJ/cm$^2$, over a duration greater than 0.1 seconds, for example 2 seconds. The second thermal processing chamber may also be a lamp processing chamber that delivers energy having density greater than 10 mJ/cm$^2$ for a duration of 1 msec to 1 sec.

Yet another embodiment includes, without limitations, a thermal processing chamber comprising a substrate support, a laser that delivers a first energy exposure, and a lamp head that delivers successive energy exposures.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
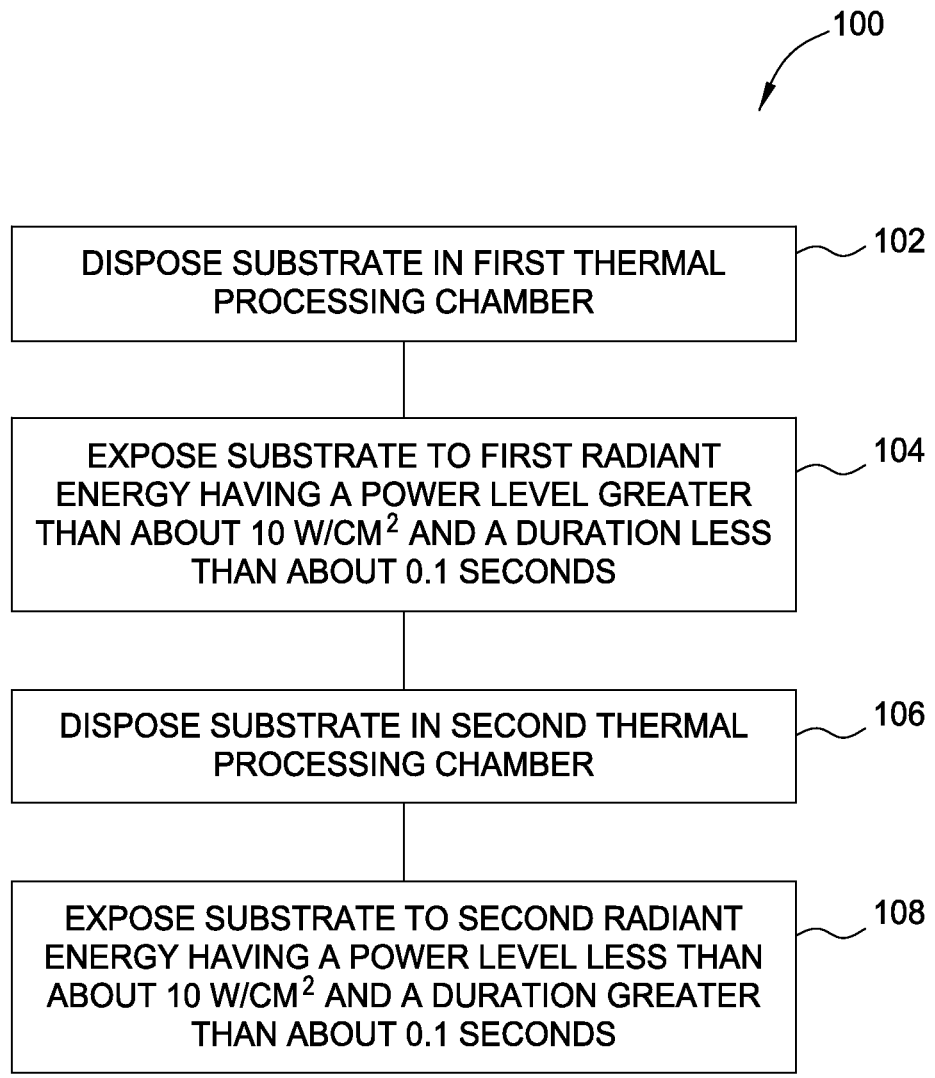
FIG. 1 is a flow diagram summarizing a method for crystallizing a semiconductor material according to one embodiment of the present invention.

FIG. 1 is a flow diagram summarizing a method 100 for crystallizing a semiconductor material according to one embodiment of the present invention. Although the method 100 is described in conjunction with FIGS. 1-5, the operations described in FIG. 1 may be performed in any order.

At 102, a substrate is disposed in a first thermal processing chamber. The substrate can be of any material used for semiconductor substrates, such as silicon, germanium, mixtures of silicon and germanium, and compound semiconductors such as III/V semiconductors and II/VI semiconductors, any of which may be doped or undoped, or dielectric materials such as ceramics, sapphire, and glass. Metal substrates containing elements such as copper and silver may also be used. In one embodiment, the substrate is designed for 3D stacked vertical NAND flash memories and comprises a 3D NAND device. However, other embodiments include substrates with 2D planar architecture.

In some embodiments, the substrate comprises a layer of semiconductor material extending from about 50 Å to about 3 µm, for example at least 1 µm, into the substrate. In one embodiment the semiconductor material is amorphous silicon. However, other semiconductor materials that may be used include elemental semiconductors such as silicon and germanium, combinations of elemental semiconductors, such as various formulations of silicon-germanium, and compound semiconductors such as Group III/V semiconductors and Group II/VI semiconductors, any of which may be doped or undoped.

The first thermal processing chamber may comprise a continuous wave scanning laser. An exemplary chamber that can be used to practice the method 100 is the ASTRA™ DSA chamber, available from Applied Materials, Inc., of Santa Clara, Calif. Other systems or platforms from other manufacturers may also be used to practice the method 100. Other embodiments include other thermal processing chambers capable of performing laser annealing processes, which may be pulsed laser chambers, semi-continuous laser chambers, continuous wave laser chambers, thermal processing chambers that use LEDs, lamp chambers that produce intense, incoherent radiation for short durations, or any other thermal processing chamber capable of heating a portion of a substrate to a temperature between about 700° C. and about 1,700° C., for example between about 1,100° C. and about 1,415° C., such as by delivering energy density greater than about 10 mJ/cm$^2$ for a duration less than about 0.1 seconds, such as between about 10 nsec and about 100 msec.

In another embodiment a single thermal processing chamber capable of heating a substrate in a first exposure to a temperature between about 700° C. and about 1,700° C., such as between about 1,100° C. and about 1,415° C., for a duration less than 0.1 seconds, for example by delivering an energy exposure with an energy density greater than 10 mJ/cm$^2$, and heating a substrate in a second exposure to a temperature between about 500° C. and about 1,300° C. for a duration greater than 0.1 seconds, such as between about 1 sec and about 6 hours, for example by delivering an energy exposure with an energy density less than 10 mJ/cm$^2$, to a substrate. Such an apparatus may deliver all of the desired energy exposures to the substrate without transferring the substrate between thermal processing chambers.

At 104 the first processing chamber delivers a first energy exposure to a portion of the substrate. The first energy exposure is of high intensity and short duration, intended to freeze nucleation and initial growth. The first energy exposure may have a power level greater than about 10 W/cm$^2$, such as between about 10 W/cm$^2$ and about 100 W/cm$^2$, for example about 20 W/cm$^2$, and a duration less than about 0.1 seconds, such between about 10 nsec and 100 msec, for example about 1 msec. During the first energy exposure, the portion of the substrate being heated reaches a temperature of about 700° C. to about 1,700° C., such as about 1,100° C. to about 1,400° C., such as about 1,100° C. to about 1,250° C., for example about 1,100° C.

The first energy exposure may be delivered by a laser annealing apparatus, such as a submelt millisecond or melt nanosecond apparatus. Submelt millisecond may be useful for some applications due to potentially more uniform crystallization along the channel. In one embodiment the first thermal processing chamber comprises a continuous wave laser that scans across the substrate in multiple passes, exposing each portion of the substrate to the first energy for a duration between about 0.25 msec and 0.1 seconds. Adjacent segments of the laser path typically overlap by 50%, but overlap may be reduced to as low as 25% to improve throughput if desired.

Alternately, the first energy exposure may be delivered by a lamp annealing apparatus that delivers radiant energy at a power level of 10 mJ/cm$^2$ or more over a duration between about 1 msec and about 1 sec over all, or a portion of, the substrate.

The first energy exposure may be delivered to the substrate multiple times in order to achieve desired electrical characteristics. However, if throughput is a concern, a single first energy exposure may be used.

At 106 the substrate is disposed in a second thermal processing chamber. The second thermal processing chamber may be a Rapid Thermal Processing (RTP) system with a radiant heat lamp or bank of heat lamps. An exemplary system that can be used to practice the method 100 is the VULCAN™ RTP chamber, available from Applied Materials, Inc., of Santa Clara, Calif. Other systems or platforms from other manufacturers may also be used to practice the method 100. The second thermal processing chamber may be any apparatus capable of heating each treated portion of the substrate to a temperature between about 700° C. and about 1,400° C., such as between about 700° C. and about 1,300° C., for a duration between about 0.1 sec and about 60 min. The second thermal processing chamber may deliver a second energy exposure having an energy density less than about 10 W/cm$^2$.

In one embodiment the second thermal processing chamber is configured to direct energy exposures to the front of the substrate. In another embodiment, the second thermal processing chamber is configured to direct energy exposures to the back side of the substrate. As previously mentioned, a single thermal processing chamber may be used to deliver both types of energy exposures to a substrate. The second thermal processing chamber is therefore optional.

At 108 the second processing chamber delivers at least one energy exposure with a duration greater than about 0.1 sec to a portion of the substrate. The energy exposure typically heats the portion of the substrate to a temperature between about 800° C. to about 1400° C., such as about 900° C. to about 1,100° C., for example about 950° C. The energy exposure may have an energy density level less than about 10 W/cm$^2$. The energy exposures delivered by the second processing chamber may have low intensity and long duration in order to further grow crystal grains using grain boundary diffusion of semiconductor atoms and attachment to existing grains. The energy exposures delivered by the second processing chamber may have a duration of 1 second to 1.5 seconds, for example 1.2 seconds, and may deliver about 0.1 mJ/cm$^2$ to 0.3 J/cm$^2$ of energy over that period of time. However, the duration may be as little as 0.1 seconds for higher intensities, for example an exposure with a power level of about 3 W/cm$^2$. The power level of the energy exposures delivered by the second processing chamber may be less than 10 W/cm$^2$, such as less than about 3 W/cm$^2$, for example 0.5 W/cm$^2$.

It should be noted that in the foregoing description reference to the first processing chamber and the second processing chamber are intended to distinguish the two processing chambers, one from the other, but are not intended to prescribe an order in which the chambers are used. Likewise, reference to the first energy exposure and the second energy exposure are intended to distinguish the two energy exposures, one from the other. The first processing chamber may be used before or after the second processing chamber, and the first energy exposure may occur before or after the second energy exposure. Subsequent references to "first" and "second", or other such use of ordinals in this specification, are likewise only used to distinguish, not to specify an order in time.

In one embodiment, a first energy exposure produces crystal nuclei, and additional successive energy exposures grow crystal grains around the nuclei. Adding additional successive energy may result in larger crystals, but will reduce throughput. Whether additional successive energy exposures are used is dependent upon the particular application as well as the grain size and throughput desired.

Figure 2A:
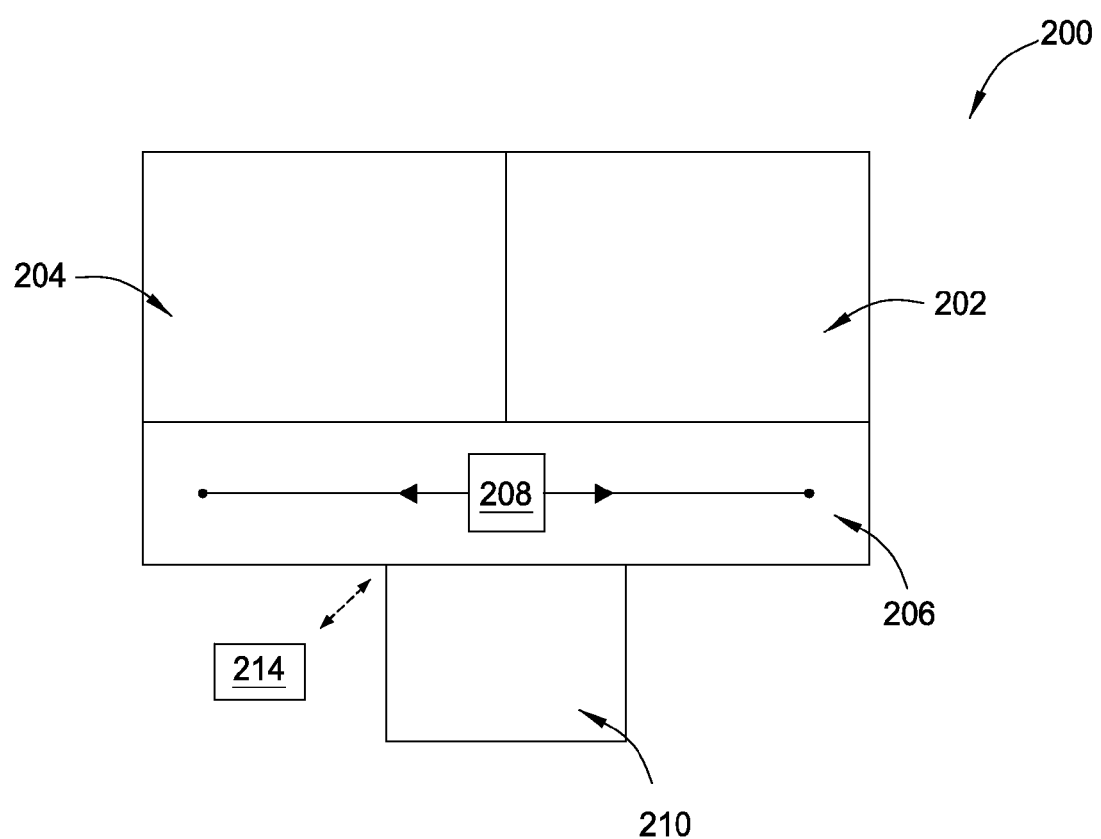
FIG. 2A illustrates a multi-chamber semiconductor crystallization system configured to implement one or more aspects of the present invention.

FIG. 2A illustrates a multi-chamber semiconductor crystallization system 200 according to one embodiment of the present invention. The system 200 may be used to perform the method 100 of FIG. 1. The semiconductor crystallization system 200 includes a first thermal processing chamber 202, a second thermal processing chamber 204, a transfer chamber 206, a substrate handling robot 208, a load lock 210, and a system controller 214. An example of a system that may be used to practice the method 100 is the VANTAGE® system available from Applied Materials, Inc., of Santa Clara, Calif.

The substrate processing system is equipped with a system controller 208 programmed to control and carry out the various processing methods and sequences performed in the semiconductor crystallization system 200. The system controller 214 is generally designed to facilitate the control and automation of the overall system and typically may include a CPU (not shown), memory (not shown), and support circuits (not shown). The CPU may be one of any form of computer processors that are used in industrial settings for controlling various system functions, chamber processes and support hardware, and monitor the system and chamber processes.

A robot 208 is disposed in the transfer chamber 206 to transfer substrates from the load lock chamber 210 to one of the processing chambers 202 and 204. The robot 208 is adapted to transfer substrate "W" to processing chambers 202 and 204 by use of commands sent from the system controller 214.

Process chambers 202 and 204 may be a laser thermal processing chambers, lamp thermal processing chambers, or other substrate thermal processing chamber. In one embodiment, the first thermal processing chamber 202 is configured to deliver energy exposures to the substrate in order to crystallize semiconductor material on the surface of the substrate. In such an embodiment, the first thermal processing chamber 202 typically heats a portion of the substrate to a temperature between about 700° C. and about 1,700° C., such as between about 1,100° C. and about 1,415° C., for a duration of less than 0.1 seconds, for example between about 10 nsec and about 100 msec. The first thermal processing chamber 202 may deliver a first energy exposure having a power level greater than about 10 W/cm$^2$ and/or an energy density greater than about 10 mJ/cm$^2$. In one embodiment, the first thermal processing chamber 202 delivers a plurality of energy exposures to the substrate all having a high intensity and short duration, for example a power level of about 20 W/cm$^2$ and a duration of about 10 ms. The first thermal processing chamber 202 may be a laser processing chamber such as a pulsed laser chamber, a semi-continuous laser chamber, a continuous wave laser chamber, a thermal processing chamber that uses LEDs, a lamp processing chamber that delivers intense incoherent light, or any other thermal processing chamber capable of heating at least a portion of a substrate to a temperature between about 700° C. and about 1,700° C., such as between about 1,100° C. and about 1,415° C., for a duration less than about 0.1 seconds.

In one embodiment the second thermal processing chamber 204 may be configured to deliver at least one successive energy exposure having a lower intensity and longer duration than the first energy exposure, for example, a power level of about 0.5 W/cm$^2$ and a duration of about 1.2 seconds to a portion of the substrate. The second thermal processing chamber may be a lamp chamber with a substrate support and one or more heat lamps arranged facing the substrate support to deliver thermal radiation to a substrate disposed on the substrate support, typically exposing the entire substrate in a single exposure. The second thermal processing chamber may instead be a furnace with a substrate support and one or more heating elements that deliver non-radiant heat to the substrate. Typically, the second thermal processing chamber 204 is capable of heating at least a portion of a substrate to a temperature between about 500° C. and about 1,300° C. for a duration greater than about 0.1 sec, such as between about 700° C. and about 1,100° C., for example about 1,050° C. The duration may be between about 0.1 sec and about 60 min.

The vacuum load lock 210 holds one or more substrates that are about to undergo processing. When the semiconductor crystallization system 200 is ready to crystallize semiconductor material on a substrate, the substrate handling robot 208, controlled by the system controller 214, removes the substrate to be processed from the vacuum load lock 210. The substrate handling robot 208 then traverses the transfer chamber 206, and disposes the substrate in the first thermal processing chamber 202.

The first thermal processing chamber 202 may deliver a first energy exposure to a portion of the substrate, the first energy exposure having a power level greater than about 10 W/cm$^2$ for example 50 W/cm$^2$ and a duration less than about 0.1 seconds, for example 20 ms. The first energy exposure may have an energy density greater than about 10 mJ/cm$^2$, for example about 50 mJ/cm$^2$. In one embodiment, the first thermal processing chamber delivers a plurality of energy exposures to the substrate to heat at least a portion of the substrate to a temperature between about 1,100° C. and about 1,415° C. Each energy exposure of the plurality of energy exposures may have a power level greater than about 10 W/cm$^2$ and a duration less than about 0.1 seconds.

In one embodiment, the first energy exposure is performed prior to performing a second energy exposure in the second thermal processing chamber. In such an embodiment, when the first thermal processing chamber 202 has delivered the prescribed number of energy exposures to the substrate, the substrate handling robot 208 removes the substrate from the first thermal processing chamber 202 and traverses the transfer chamber 206. The substrate handling robot 208 then disposes the substrate into the second thermal processing chamber 204.

The second thermal processing chamber 204 delivers at least one energy exposure having a power level that heats at least a portion of the substrate to a temperature between about 700° C. and about 1,300° C. for a duration greater than about 0.1 sec, which may be before or after the first energy exposure. The second thermal processing chamber may deliver energy at a power level less than about 3 W/cm$^2$ and/or an energy density less than about 10 mJ/cm$^2$.

In the embodiment wherein the first energy exposure is delivered before the second energy exposure, when the second thermal processing chamber 204 has delivered the prescribed number of energy exposures to the substrate in the second energy exposure, the substrate handling robot 208 removes the substrate from the second thermal processing chamber 204. The substrate handling robot then traverses the transfer chamber 206 and disposes the substrate in the vacuum load lock 210.

Figure 2B:
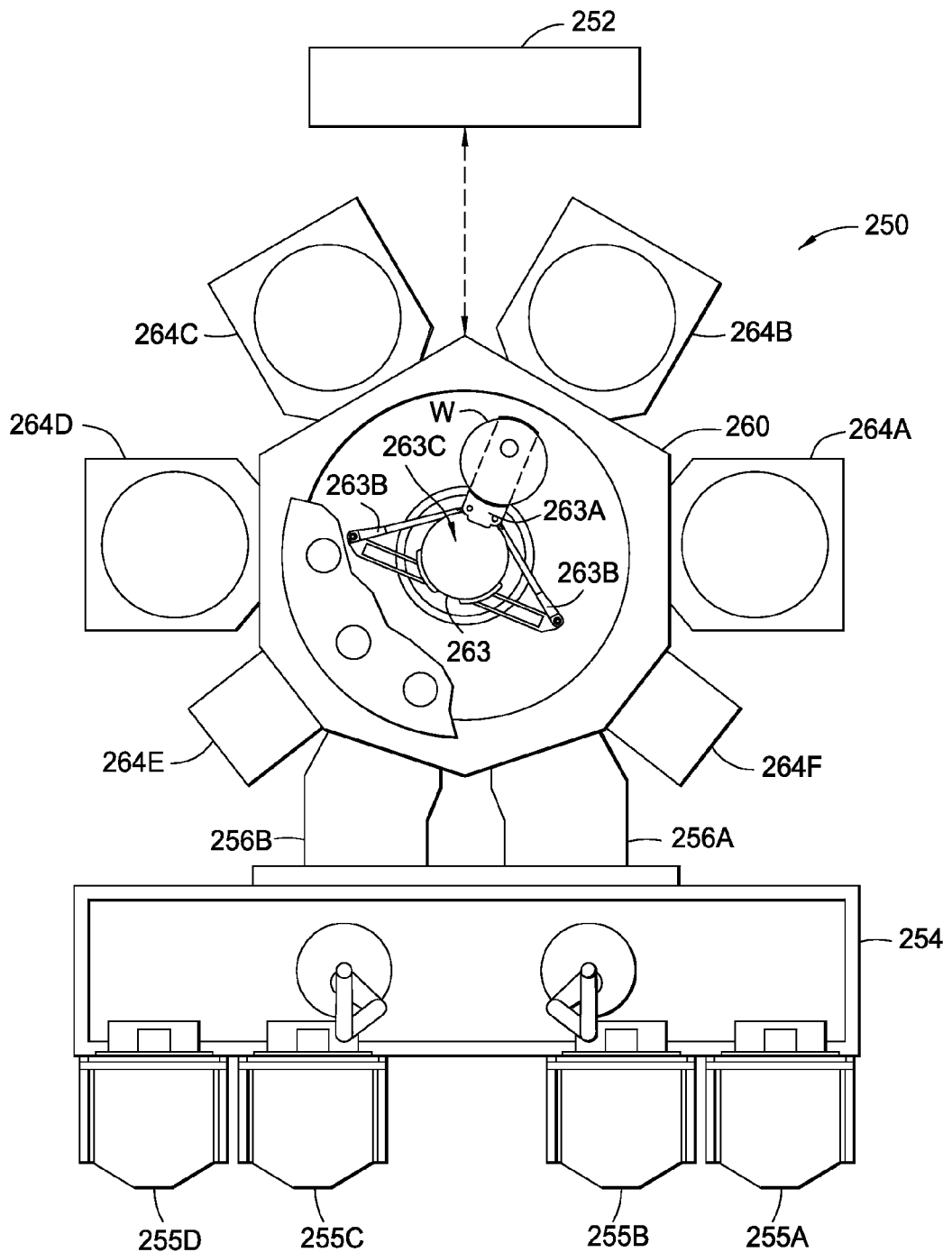
FIG. 2B illustrates a multi-chamber, multi-process substrate processing system configured to implement one or more aspects of the present invention.

FIG. 2B illustrates a multi-chamber, multi-process substrate processing system 250 according to one embodiment of the present invention. An exemplary system that can be used to practice the method 100 is the CENTURA® system, available from Applied Materials, Inc., of Santa Clara, Calif. Other systems or platforms from other manufacturers may also be used to practice the method 100. As shown, one embodiment of the substrate processing system 250 comprises a first thermal processing chamber 264A, a second thermal processing chamber 264B, a plurality of additional optional processing chambers 264C-264F, a transfer chamber 260, a substrate handling robot 263, a plurality of vacuum load locks 256A-256B, a factory interface 254, a plurality of load ports 255A-255D, and a system controller 252.

The substrate processing system is equipped with a system controller 252 programmed to control and carry out the various processing methods and sequences performed in the substrate processing system 250. The system controller 252 is generally designed to facilitate the control and automation of the overall system and typically may include a CPU (not shown), memory (not shown), and support circuits (not shown). The CPU may be one of any form of computer processors that are used in industrial settings for controlling various system functions, chamber processes and support hardware, and monitor the system and chamber processes.

A robot 263 is centrally disposed in the transfer chamber 260 to transfer substrates from the load lock chamber 256A/B to one of the various processing chambers mounted in positions 264A-F. The robot 263 generally contains a blade assembly 263A, arm assemblies 263B which are attached to the robot drive assembly 263C. The robot 263 is adapted to transfer substrate "W" to the various processing chambers by use of commands sent from the system controller 252. A plurality of slit valves (not shown) may be utilized to selectively isolate each of the process chambers 264A-264F from the transfer chamber 260 so that each chamber may be separately evacuated to perform a vacuum process during the processing sequences described herein.

Process chambers 264A-264F may include laser thermal processing chambers, lamp thermal processing chambers, furnaces, or other substrate processing chamber. In one embodiment, the first thermal processing chamber 264A is configured to deliver energy exposures to the substrate in order to crystallize semiconductor material on the surface of the substrate. In such an embodiment, the first thermal processing chamber 264A delivers a first energy exposure to a portion of the substrate, said first energy exposure heating the portion of the substrate to a temperature between about 700 and about 1,700° C., such as between about 1,100° C. and about 1,415° C. The first energy exposure may have a power level greater than about 10 W/cm$^2$ and/or a duration less than about 0.1 seconds. For example, the first energy exposure may have a power level of 20 W/cm$^2$, and a duration of 50 ms. In one embodiment, the first thermal processing chamber delivers a plurality of high intensity, short duration energy exposures to the substrate.

In one embodiment, the first thermal processing chamber 264A may also be configured to direct successive energy exposures of lower intensity and longer to the substrate, for example exposures having a power level of about 0.3 W/cm$^2$ and a duration of 1 second. In another embodiment, the first thermal processing chamber 264A may deliver a first energy exposure having a power level of about 0.3 W/cm$^2$ and a duration of 1 second, and then deliver a second energy exposure having a power level greater than about 10 W/cm$^2$ and/or a duration less than about 0.1 seconds.

The second thermal processing chamber 264B may be configured to deliver a second energy exposure to the portion of the substrate, said second energy exposure heating the portion of the substrate to a temperature between about 500° C. and about 1,300° C. The second energy exposure may have a power level less than about 10 W/cm$^2$ and/or a duration greater than 0.1 seconds to a portion of the substrate. For example, the successive energy exposures may have a power level of 0.2 W/cm$^2$ and a duration of 1 second. The second thermal processing chamber 264B may be a lamp chamber with a substrate support and one or more heat lamps arranged facing the substrate support to deliver thermal radiation to a substrate disposed on the substrate support, typically exposing the entire substrate in a single exposure. The second thermal processing chamber 264B may instead be a furnace with a substrate support and one or more heating elements to deliver non-radiant heat to the substrate.

The remaining optional processing chambers 264C-264F may be configured to perform miscellaneous other processes on the substrate. Examples may include deposition chambers for forming a 3D NAND device, such as PECVD chambers, or doping chambers such as plasma doping or plasma implantation chambers. The remaining chambers may also be further thermal processing chambers, such as those described above, to provide increased throughput.

Figure 3:
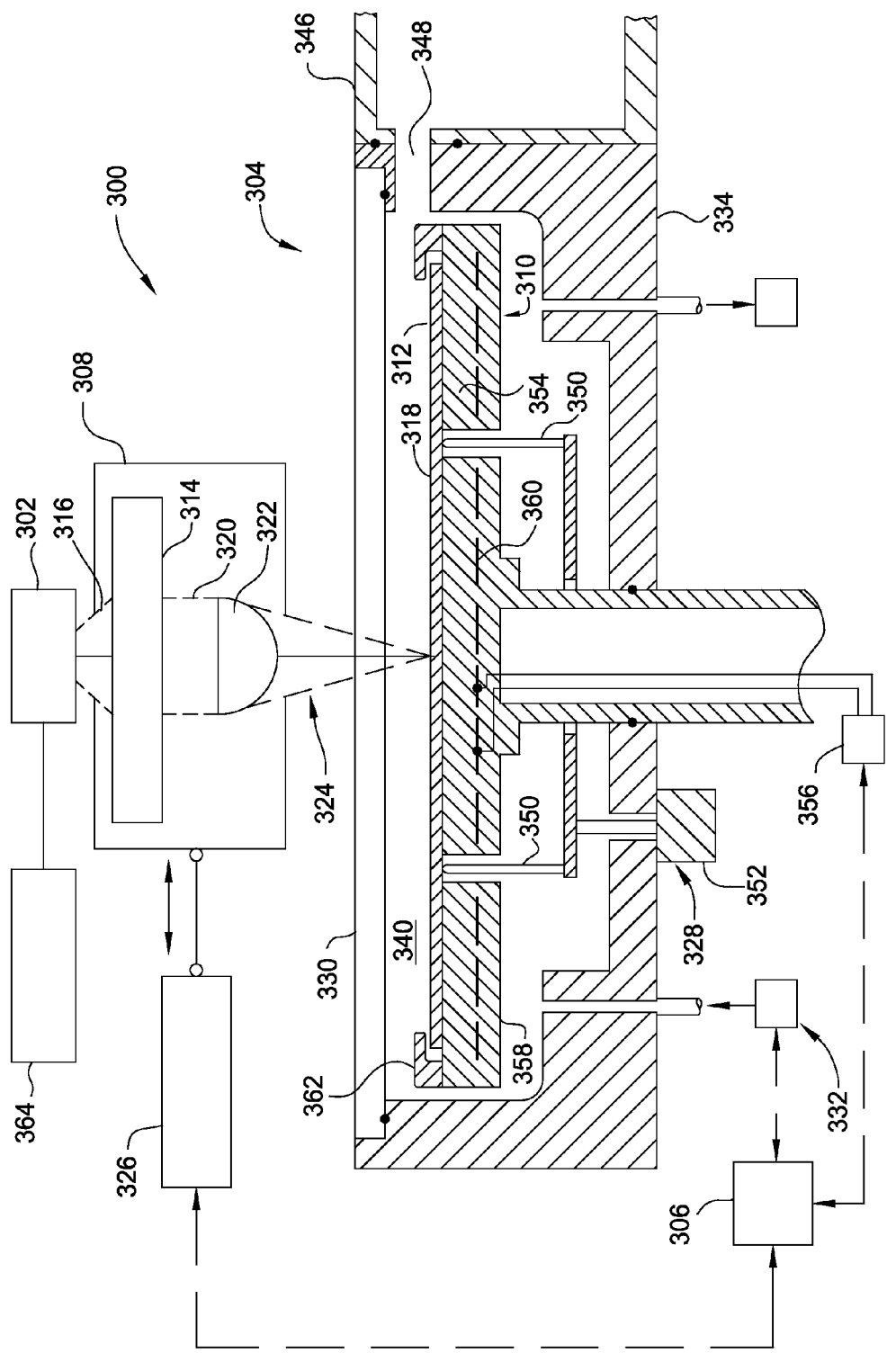
FIG. 3 illustrates a thermal processing chamber equipped with a continuous wave laser, according to one embodiment of the present invention.

FIG. 3 illustrates a thermal processing chamber equipped with a continuous wave laser that may be used to practice methods described herein. An exemplary system that can be used to practice the method 100 is the Astra™ DSA system, available from Applied Materials, Inc., of Santa Clara, Calif. Other systems or platforms from other manufacturers may also be used to practice the method 100. The apparatus 300 comprises an electromagnetic radiation source 302, a processing chamber 304, system controller 306, and optics 308 disposed between the electromagnetic radiation source 102 and the substrate support 310.

In one embodiment, the electromagnetic radiation source 302 is capable of emitting continuous waves or rays of electromagnetic radiation, such as light. The electromagnetic radiation source 302 may emit radiation continuously for at least 15 seconds. In another embodiment, the electromagnetic radiation source 302 is adapted to deliver pulsed electromagnetic energy. Typical sources of electromagnetic energy include, but are not limited to an optical radiation source, an electron beam source, a microwave energy source, and a laser source, such as a laser diode.

The optics 308 preferably comprise one or more collimators 314 to collimate radiation 316 from the electromagnetic radiation source 302 in a direction substantially perpendicular to the upper surface 318 of the substrate 312. This collimated radiation 320 is then focused by at least one lens 322 into a line of radiation 324 at an upper surface 318 of the substrate 312. Lens 322 is any suitable lens, or series of lenses, capable of focusing radiation into a desired shape, such as a line. The lens 322 may comprise one or more cylindrical lenses and one or more Fourier lenses.

The apparatus 300 also comprises a translation mechanism 326 configured to translate the line of radiation 324 and the substrate support 310 relative to one another. In one embodiment, the translation mechanism 326 is coupled to the electromagnetic radiation source 302 and/or the optics 308 to move the electromagnetic radiation source 302 and/or the optics 308 relative to the substrate support 310. In another embodiment, the translation mechanism 326 is coupled to the substrate support 310 to move the substrate support 310 relative to the electromagnetic radiation source 302 and/or the optics 308. In yet another embodiment, the translation mechanism 326 moves the electromagnetic radiation source 302 and/or the optics 308, and the substrate support 310. An x-y precision stage is one example of a translation mechanism for moving the substrate support 310 relative to the electromagnetic radiation source 302 an/or the optics 308.

The translation mechanism 326 is preferably coupled to a system controller 306 to control the scan speed at which the substrate support 310 and the line of radiation 324 move relative to one another. In addition, the translation of the substrate support 310 and the line of radiation 324 relative to one another may be along a path perpendicular to the line of radiation 324 and parallel to the upper surface 318 of the substrate 312.

The processing chamber 304 generally comprises a substrate support 310 configured to receive a substrate 312 thereon, a lift assembly 328, a transparent window 330, and a chamber 334. The transparent window 330 may comprise quartz, sapphire or other optically transparent material that allows the energy delivered from the electromagnetic radiation source 302 to pass therethrough and heat the upper surface 318 of the substrate 312 without significant energy loss. The window 330 is a barrier between the optics 308 and a processing region 340 of the processing chamber 304.

In one embodiment, the chamber 334 is coupled to transfer chamber 346 of a conventional cluster tool that contains a robot (FIGS. 2A/2B, 3, and 5) that is adapted to transfer a substrate to and from the processing region 340 of the processing chamber 304 through an access port 348. In one configuration, the transfer chamber 346 may be isolated from the processing region 340 of the processing chamber 304 by use of a conventional slit valve (not shown), or gate valve, to prevent contaminants from passing in either direction through the access port 348.

The lift assembly 328 generally contains a plurality of lift pins 350 and an actuator 352 (e.g., air cylinder, DC servo motor and lead screw) that are adapted to move relative to the substrate support 310 so that a substrate 312 can be transferred to and from the substrate support 310, and to and from a substrate transferring device, such as a robot. As shown in FIG. 3, the lift pins 350 are in the "down" position so that the substrate 312 can be positioned on the substrate supporting surface 354 of the substrate support 310.

The substrate support 310 may comprise a platform capable of supporting the substrate 312, as explained below. In one embodiment, the substrate support 310 includes a means for grasping the substrate, such as a frictional, gravitational, mechanical, or electrical system. Examples of suitable means for grasping include mechanical clamps, electrostatic chuck, vacuum chuck, or the like.

The substrate support 310 generally contains a support 358, and a fluid delivery system 356 that are in communication with the system controller 306. In one embodiment, the substrate 312 can be supported on the fluid delivered from a fluid delivery system to ports formed in the substrate supporting surface 354 of the support 358. During one or more steps during thermal processing, a substrate 312 can be supported on a cushion of gas above the substrate supporting surface 354 due to the fluid delivered through plenum 360 to the ports, so that a gap can be formed. The gap created by the fluid may be between about 1 μm and about 1000 μm. In one embodiment, the support 358 may be formed from a metal, ceramic, plastic, semiconductor or other material used to support substrates during processing.

In one embodiment, a shadow ring 362 may be disposed over a portion of the substrate support 310 and a substrate 312 when it is positioned on the substrate supporting surface 354, as shown in FIG. 1. The shadow ring 362 is generally designed to shadow the edge of the substrate 312 to reduce any thermal uniformity edge effects and prevent substrate 312 breakage as the line of radiation 324 is swept across the surface of the substrate 312. The shadow ring 362 may be positioned relative to the substrate 312 and/or substrate supporting surface 354 by use of a shadow ring lift assembly (not shown) to allow the substrate to be transferred between the substrate supporting surface 354 and a robot (not shown) without interfering with the shadow ring 362. The shadow ring 362 may be made of material that has a desired thermal mass, a desirable emissivity and absorption coefficient, and is able to withstand the energy delivered by the electromagnetic radiation source 302.

The electromagnetic radiation source 302 may comprise a plurality of electromagnetic radiation sources 302 and be controlled by a controller 364. The electromagnetic radiation source 302 may comprise a plurality of light sources that permit a user to select one or more light sources for radiating the substrate 312. In one embodiment, a single light source may be selected. In another embodiment, multiple light sources may be selected. In another embodiment, multiple light sources capable of emitting different wavelengths may be selected.

The user may preselect the intensity of the electromagnetic radiation, frequency of the electromagnetic radiation, and time of exposure of the electromagnetic radiation. Additionally, the user may adjust the intensity, frequency, and time of exposure to suit the needs of the process.

The optics 308 may diffract and/or reflect the selected wavelength or wavelengths passing therethrough such that the light emitting in a line of radiation 324 has a wavelength that is less than a critical dimension of the substrate. When a plurality of wavelengths are emitted from the electromagnetic radiation source 302, the average wavelength, after diffraction and/or reflection, may be less than or equal to the critical dimension of the substrate.

In one embodiment, the light source may comprise a laser diode. In another embodiment, the plurality of light sources may comprise one or more laser diodes. Thus, a plurality of laser diodes may be utilized. The laser diodes may emit light at the same wavelength or at different wavelengths. In one embodiment, the power of the laser diodes may be in the range of 0.5 kW to 50 kW.

Just one possible embodiment of the first thermal processing chamber is illustrated in FIG. 3. Other embodiments include other thermal processing chambers capable of performing pulsed laser annealing processes, thermal processing chambers that use LEDs, lamp chambers, or any other thermal processing chamber capable of heating at least a portion of a substrate to a temperature of at least about 1,100° C., for example by delivering energy exposures with a power level greater than about 10 W/cm$^2$, for a duration less than about 0.1 seconds. In another embodiment a single thermal processing chamber may capable of delivering such energy exposures followed by subsequent energy exposures that heat at least a portion of the substrate to a temperature less than about 1,300° C., for example by delivering energy exposures with a power level less than 10 W/cm$^2$, for a duration greater than 0.1 second, thus delivering all desired energy exposures to the substrate without having to move the substrate between thermal processing chambers.

Figure 4:
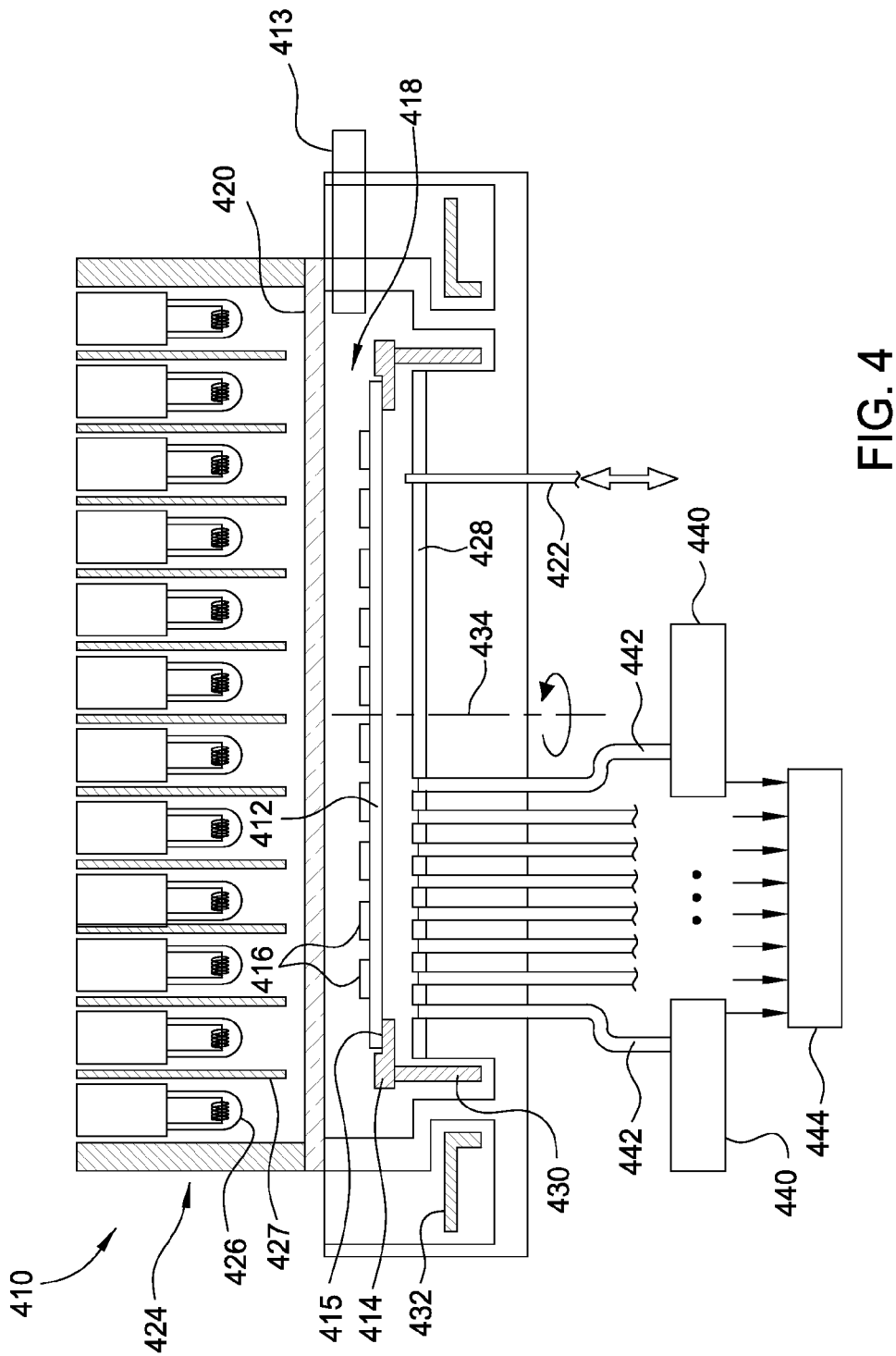
FIG. 4 illustrates a thermal processing chamber equipped with a lamp head, according to one embodiment of the present invention.

FIG. 4 illustrates a thermal processing chamber 410 equipped with a lamp head 424, according to one embodiment of the present invention. The chamber 410 of FIG. 4 may be used to practice methods described herein. An exemplary chamber that can be used to practice the method 100 is the RADIANCE® chamber, available from Applied Materials, Inc., of Santa Clara, Calif. Other systems or platforms from other manufacturers may also be used to practice the method 100.

A substrate 412, for example a semiconductor substrate such as a silicon wafer to be thermally processed is passed through the valve or access port 413 into the process area 418 of the chamber 410. The substrate 412 is supported on its periphery by a substrate support 414, which may be an edge ring having a sloping shelf 415 contacting the corner of the substrate 412. The substrate 412 is oriented such that features 416 already formed on a front surface of the substrate 412 face a process area 418 defined by a transparent quartz window 420. The features 416 define a 3-dimensional pattern within and near the plane of the substrate surface. Lift pins 422 may be raised and lowered to support the back side of the substrate 412 when the substrate 412 is handed between a substrate handler bringing the substrate into the chamber and onto substrate support 414. A radiant heating apparatus 424 is positioned opposite the window 420 from the substrate support 414 to direct radiant energy toward the substrate support 414 to heat the substrate 412. In the chamber 410, the radiant heating apparatus may have a large number, 409 being an exemplary number, of high-intensity tungsten-halogen lamps 426 positioned in respective reflective hexagonal tubes 427 arranged in a close-packed arrangement. The array of lamps 426 is sometimes referred to as the lamp head. Other radiant heating apparatus may be substituted. Generally, these involve resistive heating to quickly ramp up the temperature of the radiant source.

As used herein, RTP refers to an apparatus or a process capable of uniformly heating a substrate at rates of about 50° C./second and higher. Typical cooling rates in RTP chambers are in the range of 80° C./second to 150° C./second. Some processes performed in RTP chambers require variations in temperature across the substrate of less than a few degrees Celsius. Thus, an RTP chamber may include a lamp or other suitable heating system and heating system control capable of heating at rate of up to 100° C./second to 150° C./second, and 200° C./second to 400° C./second.

A reflector 428 extends substantially parallel to the window 420 and covers an area greater than an area of the substrate 412. The reflector 428 may face the back side of the substrate 412. The reflector 428 reflects heat radiation emitted from the substrate 412 back toward the substrate 412. The reflector 428, which may be formed of a gold coating or multi-layer dielectric mirror, effectively forms a black-body cavity at the back of the substrate 412 that tends to distribute heat from warmer portions of the substrate 412 to cooler portions. The reflector 428 may be disposed on a water-cooled base to remove excess radiation from the substrate 412, especially during cool down.

One way of improving processing uniformity includes supporting the edge ring 414 on a rotatable cylinder 430 that is magnetically coupled to a rotatable flange 432 positioned outside the chamber. A motor (not shown) rotates the flange 432 and hence rotates the substrate about its center 434, which is also the centerline of the generally symmetric chamber.

In another embodiment, when the substrate 412 is in a lower position, proximate the reflector 428, the thermal conduction from the substrate 412 to the reflector 428 increases and enhances the cooling process. The increased rate of cooling in turn promotes optimal RTP performances. The closer the substrate 412 is positioned to the reflector 428; the amount of thermal exposure will proportionally decrease. The embodiment shown in FIG. 4 allows the substrate 412 support to be easily levitated at different vertical positions inside the chamber to permit control of the substrate's thermal exposure.

Figure 5:
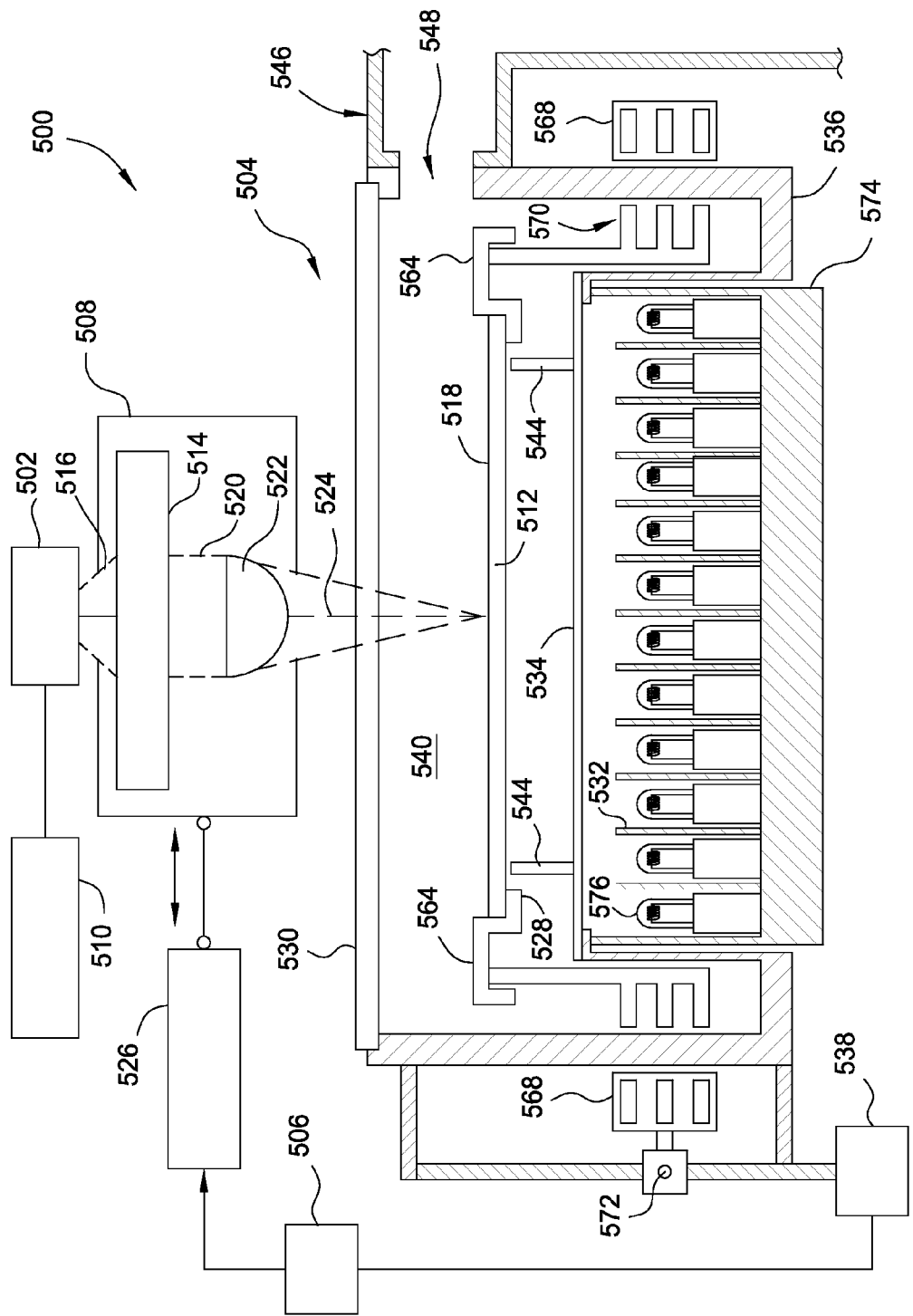
FIG. 5 illustrates a thermal processing chamber according to one embodiment of the present invention.

FIG. 5 illustrates a thermal processing chamber according to one embodiment of the present invention. The apparatus 500 comprises a processing chamber 504, a substrate support 564, a lamp head 574, a source of electromagnetic radiation 502, and a system controller 506.

The processing chamber 504 typically includes a substrate access port 548 to facilitate entry and egress of a substrate 512. The access port may be coupled to a transfer chamber 546 or a load lock chamber (FIGS. 2A/2B). The chamber 504 also includes transparent windows 530 and 534, above and below the substrate, made from a material transparent to heat and light of various wavelengths, which may include light in the infrared spectrum, through which photons from the heat sources 574 and 502 may heat the substrate 512. In one embodiment, windows 530 and 534 are made of quartz material or a material derived from quartz, although other materials that are transparent to light may be used, such as sapphire. The window 534 may also include a plurality of lift pins 544, which function as a temporary support structure. Lift pins 544 are adapted to selectively contact and support the substrate 512 to facilitate transfer of the substrate into and out of the chamber 504.

In one embodiment, a stator assembly 568 circumscribes the chamber body 536 and is coupled to one or more actuator assemblies 572 that control the elevation of the stator assembly 568 along the exterior of the chamber body 536. The stator assembly 568 may be magnetically coupled to the substrate support 564 disposed within the interior volume of the chamber body 536. The substrate support may comprise a rotor system 570, which creates a magnetic bearing assembly to lift and/or rotate the substrate support 564.

In one embodiment, a motor 538, such as a stepper or a servo motor, is coupled to the actuator assembly 572 to provide controllable rotation in response to a signal by the controller 506. Alternatively, other types of actuators 572 may be utilized to control the linear position of the stator 568, such as pneumatic cylinders, hydraulic cylinders, ball screws, solenoids, linear actuators, and cam follows among them.

A lamp head 574 may be positioned below the substrate 512 and window 534. The lamp head 574 includes a plurality of high-intensity tungsten-halogen lamps 576 positioned in reflective hexagonal tubes 532. In one embodiment, the lamp head 574 has 409 lamps.

In one embodiment, the electromagnetic radiation source 502 positioned above the substrate is capable of emitting continuous waves or rays of electromagnetic radiation 516, such as light. In one embodiment, the electromagnetic radiation source 502 is capable of emitting radiation continuously for at least 15 seconds. In another embodiment, the electromagnetic radiation source 502 is adapted to deliver electromagnetic energy that is used to perform a pulse laser anneal process. Typical sources of electromagnetic energy include, but are not limited to an optical radiation source, an electron beam source, a microwave energy source, and a laser diode. The electromagnetic radiation 516 may be visible light, infrared, or UV light having wavelength between about 300 nm and about 2 µm.

The optics 508 preferably comprise one or more collimators 514 to collimate radiation 516 from the electromagnetic radiation source 102 in a direction perpendicular to the upper surface 518 of the substrate 512. This collimated radiation 520 is then focused by at least one lens 522 into a line of radiation 524 at an upper surface 518 of the substrate 512. Lens 522 is any suitable lens, or series of lenses, capable of focusing radiation into a desired shape, such as a line. The lens 522 may be a cylindrical lens, one or more concave lenses, convex lenses, plane mirrors, concave mirrors, convex mirrors, refractive lenses, diffractive lenses, Fresnel lenses, gradient index lenses, or the like.

The apparatus 500 also comprises a translation mechanism 526 configured to translate the line of radiation 524 relative to the substrate support 564. Any suitable translation mechanism may be used, such as a conveyor system, rack and pinion system, mechanical actuator, or the like. The translation mechanism 526 is preferably coupled to a system controller 506 to control the scan speed at which the line of radiation 524 moves relative to the substrate support 564. In addition, the translation of the line of radiation 524 relative to the substrate support 564 may be along a path perpendicular to the line of radiation 524 and parallel to the upper surface 518 of the substrate 512.

The electromagnetic radiation source 502 may comprise a plurality of electromagnetic radiation sources 502 and be controlled by a controller 510. The electromagnetic radiation source 502 may comprise a plurality of light sources that permit a user to select one or more light sources for radiating the substrate 512. In one embodiment, a single light source may be selected. In another embodiment, multiple light sources may be selected. In another embodiment, multiple light sources capable of emitting substantially the same wavelength may be selected. In another embodiment, multiple light sources capable of emitting different wavelengths may be selected.

The individual light sources may be indexed to the collimator 514 to individually radiate a predetermined wavelength. A user preselects a desired wavelength for exposing the substrate 512. The controller 510 then selectively indexes the particular light source to the collimator 514. In one embodiment, a user may preselect a plurality of wavelengths for exposing the substrate 512. The controller 510 then indexes the plurality of light sources to the collimator 514.

The user may preselect the intensity of the electromagnetic radiation, frequency of the electromagnetic radiation, and time of exposure of the electromagnetic radiation. Additionally, the user may adjust the intensity, frequency, and time of exposure to suit the needs of the process. The adjusting may occur between exposures or during exposures. The adjusting may occur based upon real time feedback from metrology results.

The optics 508 may diffract and/or reflect the selected wavelength or wavelengths passing therethrough such that the light emitting in a line of radiation 524 has a wavelength that is less than a critical dimension of the substrate. When a plurality of wavelengths are emitted from the electromagnetic radiation source 502, the average wavelength, after diffraction and/or reflection, may be less than or equal to the critical dimension of the substrate. The critical dimension may be about 65 nm or less. By selecting a wavelength that, after diffraction and/or reflection, is less than the critical dimension, precise control of the substrate exposure may occur.

In one embodiment, the electromagnetic radiation source 502 may comprise a laser diode. In another embodiment, the plurality of light sources may comprise one or more laser diodes. Thus, a plurality of laser diodes, such as a laser diode bar or laser diode array, may be utilized. The laser diodes may emit light at the same wavelength or at different wavelengths. In one embodiment, the electromagnetic radiation source 502 is adapted to deliver energy at a wavelength less than about 1064 nm to a primarily silicon containing substrate. In one embodiment, the power of the laser diodes may be in the range of 0.5 kW to 50 kW.

In another embodiment, the electromagnetic radiation source 502 may comprise one or more solid state laser sources, such as titanium-sapphire, Nd:YAG, or other rare-earth doped crystalline materials or glasses. The one or more solid state laser sources may operate at wavelengths in the visible spectrum, the UV spectrum, and/or the IR spectrum. A frequency-doubled Nd:YAG laser operating at about 532 nm may be used. In other embodiments, the electromagnetic radiation source 502 may comprise one or more gas lasers, excimer lasers, or other types of lasers having power levels and wavelengths suitable for thermal processing of semiconductor substrates.

The electromagnetic radiation source 502 may be continuous wave, quasi-continuous, or pulsed. A radiation source that can continuously emit radiation for 10 seconds or more may be used. A radiation source that pulses at a high rate, for example a kilohertz pulsed source, may be used. A radiation source, that pulses at a moderate rate, for example a source that pulses at a rate of less than 10 Hz, may be used.

A substrate 512 to be thermally processed is passed through the access port 548 into the processing region 540 of the chamber body 536. The substrate 512 is supported on its periphery by the substrate support 564, the substrate support having an annular sloping shelf 528 contacting the corner of the substrate 512.

Apparatus and methods for crystallizing amorphous semiconductor materials that results in large, uniform grain size are described herein. The techniques may involve directing a first energy exposure having a high intensity and short duration, for example an exposure having a power level greater than about 10 W/cm$^2$ and a duration of less than 0.1 seconds, to a semiconductor material to freeze nucleation and initial growth of grains. At least one successive energy exposure having a lower intensity and longer duration, for example an exposure having a power level less than about 10 W/cm$^2$ and a duration of greater than 0.1 seconds, is then directed to the semiconductor material to further grow the crystal grains using grain boundary diffusion. The first energy exposure may heat a portion of a treated substrate to a temperature of at least 700° C., such as at least 1,100° C., for example at least 1,200° C., while the second exposure may heat the portion of the treated substrate to a temperature no more than about 1,300° C., for example about 1,000° C.

Some methods of semiconductor crystallization use at least one high intensity, low duration energy exposure directed to a portion of the substrate to freeze nucleation and initial growth. At least one successive low intensity, long duration energy exposure is then directed to the portion of the substrate to further grow the crystal grains. This method results in crystal grains that are large, and uniform in size from the top of the transistor channel to the bottom of the transistor channel of a 3D NAND memory device. Other methods of crystallization may feature a low intensity long duration energy exposure followed by a short high intensity exposure.

While the foregoing is directed to embodiments of the present invention, other and further embodiments of the invention may be devised without departing from the basic scope thereof, and the scope thereof is determined by the claims that follow.

The invention claimed is:

1. A method of treating a substrate, comprising:
   delivering a first radiant energy exposure that heats a portion of the substrate to a temperature between about 700° C. and about 1,700° C. for a duration less than about 0.1 seconds; and
   delivering at least one second radiant energy exposure that heats the portion of the substrate to a temperature between about 500° C. and about 1,300° C. for a duration greater than about 0.1 seconds, wherein one of the first and second radiant energy exposures comprises exposing the substrate to radiant energy having an energy density less than about 10 mJ/cm$^2$.

2. The method of claim 1, wherein the substrate comprises amorphous silicon.

3. The method of claim 1, wherein a portion of the substrate comprises an amorphous silicon region extending at least 50 Å to 3 µm into the substrate surface.

4. The method of claim 1, wherein the substrate comprises a 3D-NAND device.

5. The method of claim 1, wherein the first radiant energy exposure is provided by a continuous wave laser.

6. The method of claim 5, wherein delivering the first radiant energy exposure comprises scanning the continuous wave laser across the substrate in a path wherein adjacent segments of the path overlap by at least about 25%.

7. The method of claim 6, wherein the first radiant energy exposure heats the substrate to a temperature between about 1,100° C. and about 1,415° C.

8. The method of claim 1, wherein the first radiant energy exposure is provided by a lamp.

9. The method of claim 8, wherein the second radiant energy exposure heats the substrate to a temperature between 700° C. and 1,300° C.

10. The method of claim 1, wherein delivering the first radiant energy exposure comprises scanning a continuous wave laser across the substrate, exposing each portion of the substrate to the first radiant energy for a duration between about 1 millisecond and 0.1 seconds, and the entire substrate is exposed to the second radiant energy exposure over a duration from about 0.1 seconds to about 1.5 seconds.

11. The method of claim 1, wherein the second radiant energy exposure is performed after the first radiant energy exposure.

12. The method of claim 1, wherein the second radiant energy exposure is performed using a furnace.

13. The method of claim 1, wherein the substrate is exposed to the second radiant energy for a duration between about 1 sec and about 6 hours.

14. A method of crystallizing a semiconductor material comprising:
    heating a portion of the semiconductor material to a temperature between about 700° C. and about 1,700° C. by delivering a first plurality of radiant energy exposures having a duration less than about 0.1 seconds to the portion; and
    heating the portion of the semiconductor material to a temperature between about 500° C. and about 1,300° C. by delivering at least one second radiant energy exposure having a duration greater than about 0.1 seconds.

15. The method of claim 14, wherein the first plurality of radiant energy exposures have a power level greater than about 10 W/cm$^2$ and a duration less than about 0.01 seconds.

16. The method of claim 14, wherein the semiconductor material comprises amorphous silicon.

17. The method of claim 14, wherein the first plurality of radiant energy exposures is provided by a continuous wave laser.

18. The method of claim 17, wherein delivering the first plurality of radiant energy exposures comprises scanning the continuous wave laser across the substrate in a path wherein adjacent segments of the path overlap by at least about 25%.

19. A thermal processing apparatus comprising:
    a continuous wave laser process chamber wherein the laser delivers energy exposures to a semiconductor material, the exposures having a power level greater than about 10 W/cm$^2$, and having a duration less than about 0.1 seconds;
    a transfer chamber coupled to the continuous wave laser process chamber;
    a lamp treatment chamber coupled to the transfer chamber, wherein said lamp treatment chamber delivers energy exposures having a power level less than about 10 W/cm$^2$, and having a duration of more than 0.1 seconds.

20. The thermal processing apparatus of claim 19, wherein the continuous wave laser process chamber comprises a laser scanning chamber.

\* \* \* \* \*